US007357840B2

United States Patent
Nguyen (10) Patent No.: US 7,357,840 B2
(45) Date of Patent: Apr. 15, 2008

(54) SOLVENT BATH AND DRAIN

(75) Inventor: Andrew P. Nguyen, San Jose, CA (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/788,578

(22) Filed: Feb. 27, 2004

(65) Prior Publication Data
US 2005/0188919 A1    Sep. 1, 2005

(51) Int. Cl.
*B05B 15/02* (2006.01)
*B05B 3/00* (2006.01)
*B05C 11/02* (2006.01)

(52) U.S. Cl. .................. 118/302; 118/323; 118/52; 239/106

(58) Field of Classification Search ........... 118/302, 118/319, 52, 612, 320, 56, 323; 427/240; 239/104, 106, 120–122; 134/198, 902, 153, 134/104.1, 104.2, 104.3, 104.4
See application file for complete search history.

(56) References Cited

U.S. PATENT DOCUMENTS 5,002,008 A * 3/1991 Ushijima et al. ........... 118/313
5,938,847 A * 8/1999 Akimoto et al. ............ 118/665
5,993,552 A * 11/1999 Tsukamoto et al. ......... 118/319
6,210,481 B1 * 4/2001 Sakai et al. ................. 118/697
6,715,943 B2 * 4/2004 Nagamine ................... 396/611

FOREIGN PATENT DOCUMENTS

JP    2001205162 A  *  7/2001

OTHER PUBLICATIONS

English Translated Abstract and Detailed Description of JP-2001-205162A.*
ASML. 9X Track System Solvent Bath, Figures 1-3 and description of Figures, Jun. 2000. (4 pages).

* cited by examiner

*Primary Examiner*—Yewebdar Tadesse
(74) *Attorney, Agent, or Firm*—Blakely, Sokoloff, Taylor & Zafman LLP (57) ABSTRACT

According to one aspect of the invention, a wafer processing apparatus is provided. The wafer processing apparatus may include a wafer support, a dispense head, and a solvent bath. The dispense head may be moveable between a position over the wafer support and a position over the solvent bath. When the dispense head is positioned over the solvent bath, a fluid dispensed from the dispense head may enter a drain and nozzles on the dispense head may be exposed to a controlled atmosphere within a chamber of the solvent bath.

31 Claims, 11 Drawing Sheets

SOLVENT BATH AND DRAIN

BACKGROUND OF THE INVENTION

1). Field of the Invention

This invention relates to a solvent bath and drain, in particular a solvent bath and drain for use on a semiconductor substrate processing apparatus, and a method of draining a dispense head.

2). Discussion of Related Art

Integrated circuits are formed on semiconductor wafers. The formation of the integrated circuits may include numerous processing steps such as deposition of various layers, etching some of the layers, and multiple bakes.

Often the processing of semiconductor wafers takes place in large wafer processing machines. One of the components found in these machines are known as modules. These modules may receive a semiconductor wafer from another component, place the wafer on a wafer support, and dispense a solution, such as photoresist, onto the wafer as one of the many steps included in wafer processing. The photoresist may be dispensed onto the wafers from a dispense head attached to a dispense arm that is moveably connected to the module. Typically, the photoresist is fed into inlets of the dispense head where is passes through a chamber within the dispense head before it is dispensed onto the wafer through nozzles on the dispense head.

While the dispense head is not in use, the dispense head may be moved off to the side of the module. Often, some of the photoresist dries within the dispense head and is later dispensed onto the wafer, causing defects on the wafer. In order to prevent the photoresist from drying within the dispense head, some of the photoresist may be occasionally dispensed, or purged, into a small drain, typically approximately every thirty minutes. The small size of the drain allows only one nozzle to be purged at a time. The nozzles of the dispense head may also be placed, on or directly into an open solvent bath, separate from the drain, which keeps the nozzles moist and further prevents the photoresist from drying within the dispense head.

Because of the small size of the drain and the fact that the solvent bath is separate from the drain, the dispense arm must repeatedly move the dispense head back and forth between the solvent bath and the drain in order to prevent the photoresist from drying in the dispense head. This extra movement reduces the speed at which wafers can be processed and increases the wear on the dispense arm, thereby decreasing the longevity, durability, and reliability of the dispense arm. Additionally, because the solvent bath is open to the air, much of the volatile solvent evaporates and is lost. The photoresist and the solvent are often very expensive and having to waste photoresist and replace the solvent so often greatly increase the cost of semiconductor wafer processing.

SUMMARY OF THE INVENTION

The invention provides a semiconductor substrate, or wafer, processing apparatus. The wafer processing apparatus may include a wafer support, a dispense head, and a solvent bath. The dispense head may be moveable between a position over the wafer support and a position over the solvent bath. When the dispense head is positioned over the solvent bath, a fluid dispensed from the dispense head may enter a drain and nozzles on the dispense head may be exposed to a controlled atmosphere within a chamber of the solvent bath.

BRIEF DESCRIPTION OF THE DRAWINGS

The invention is described by way of example with reference to the accompanying drawings, wherein.

DETAILED DESCRIPTION OF THE INVENTION

FIG. 1 to FIG. 6F of the accompanying drawings illustrate a semiconductor substrate, or wafer, processing apparatus. The wafer processing apparatus may include a wafer support, a dispense head, and a solvent bath. The dispense head may be moveable between a position over the wafer support and a position over the solvent bath. When the dispense head is positioned over the solvent bath, a fluid dispensed from the dispense head may enter a drain within the solvent bath and nozzles on the dispense head may be exposed to a controlled atmosphere within a chamber of the solvent bath.

Figure 1:
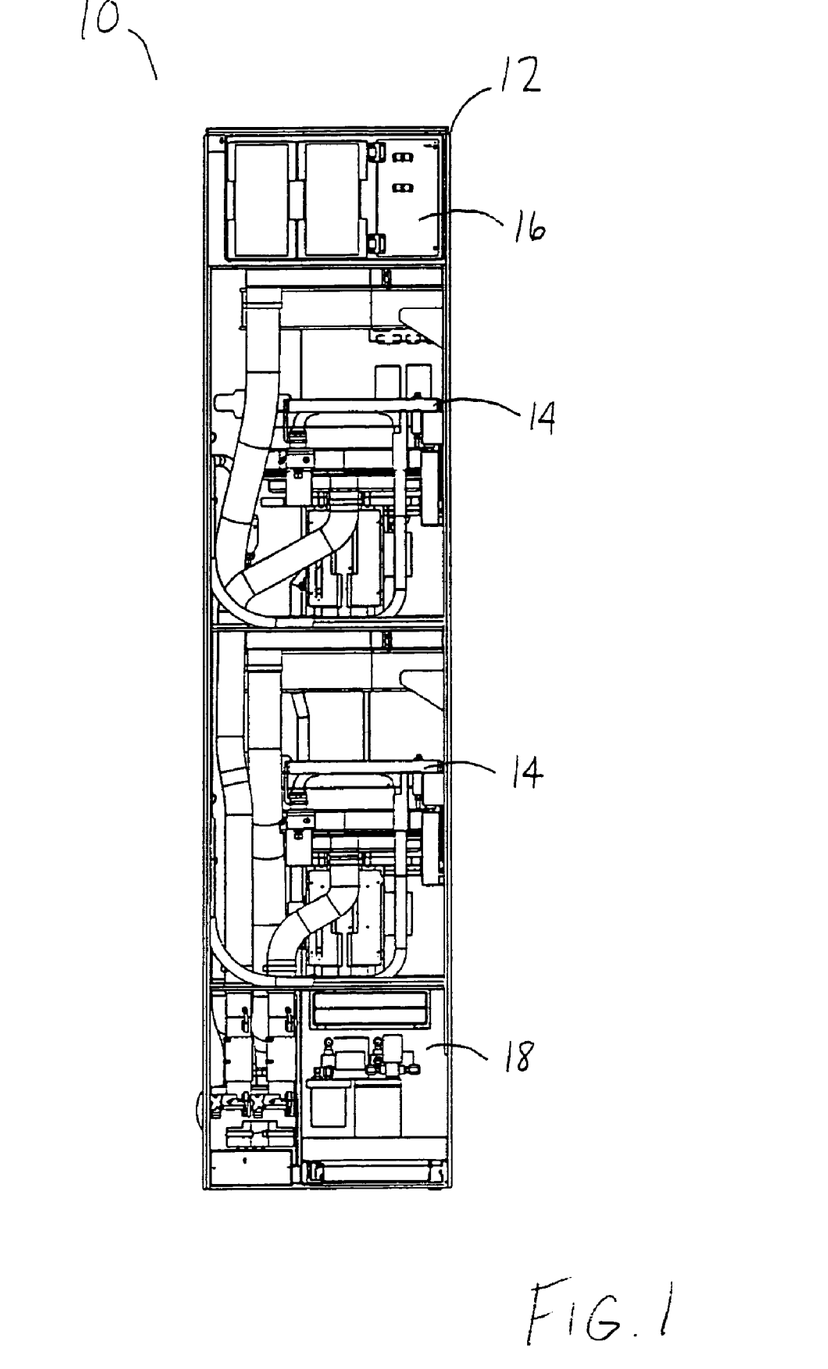
FIG. 1 is a cross-sectional side view of a module stack in a semiconductor wafer processing system, including coater modules, a computer controller, and photoresist pump drawers.

FIG. 1 illustrates a module stack 10 from a semiconductor wafer processing system. In an embodiment, the module stack 10 may include a frame 12, coater modules 14, a computer controller 16, and photoresist pump drawers 18.

The photoresist pump drawers 18 may lay at the bottom of the stack 10 and although not shown in detail, may include a photoresist supply and pumps to supply photoresist solvent, or other semiconductor processing fluids, to other components of the stack 10, such as the coater modules 14. The coater modules 14 may be vertically stacked above the photoresist pump drawers 18 and may be substantially identical.

The computer controller 16 may lie on top of the coater modules 14 and, although not shown in detail, may be electrically connected to the coater modules 14 and the photoresist pump drawers 18, and include a computer with a memory for storing a set of instructions and a processor connected to the memory for executing the instructions, as is commonly understood in the art.

Figure 2:
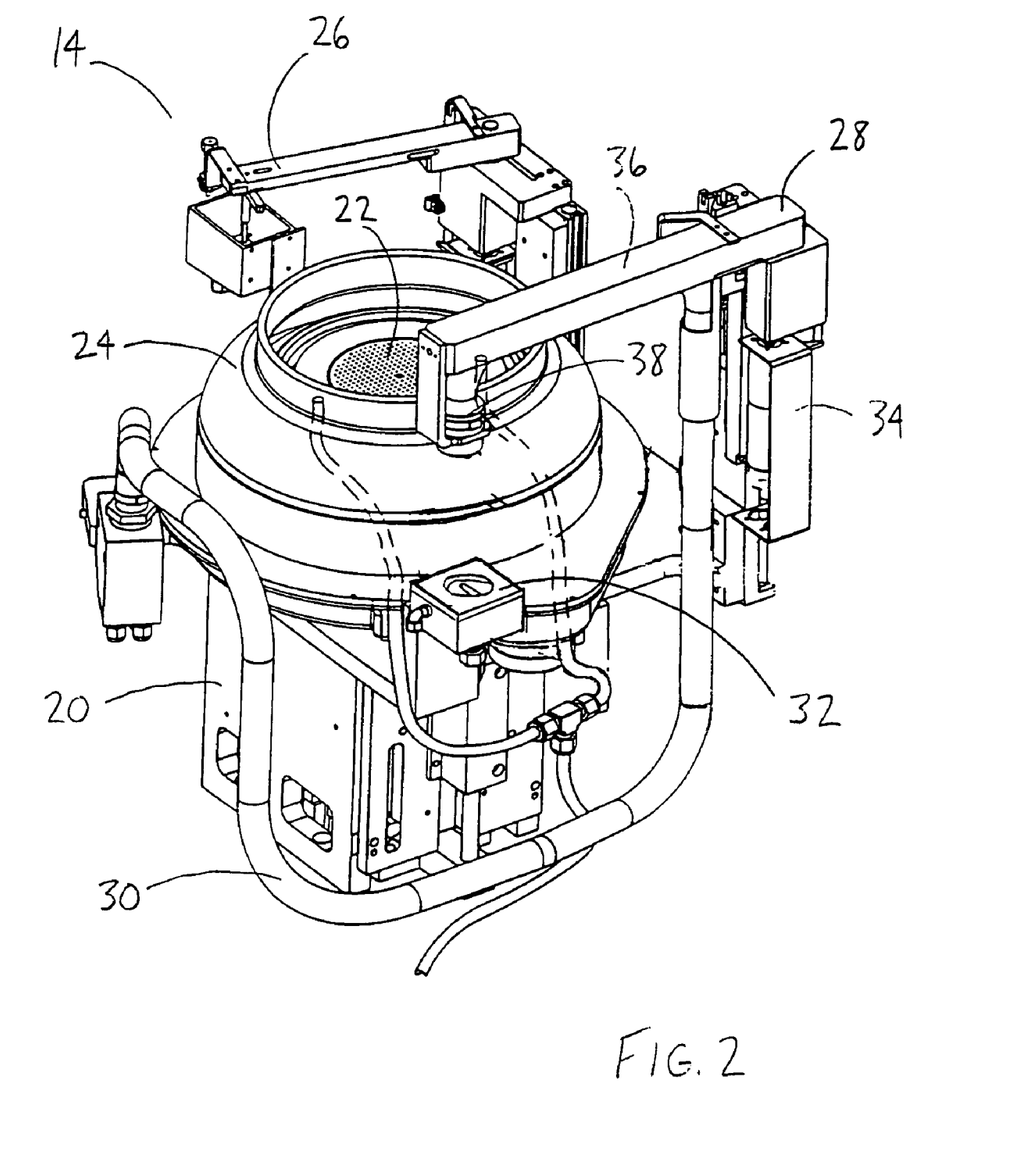
FIG. 2 is a perspective view of one of the coater modules of FIG. 1, including a dispense arm and a solvent bath.

FIG. 2 illustrates one of the coater modules 14. The coater module 14 may include a base 20, a wafer chuck 22, a catch cup 24, a Top Edge Bead Removal (TEBR) arm 26, a dispense arm 28, a photoresist supply line 30, and a solvent bath 32.

The base 20 may be attached to the frame 12 of the module stack 10 and be substantially cubic in shape. The wafer chuck, also known as a substrate or wafer support, 22 may be on top of the base 20, circular in shape, and connected to the base 20 to rotate about a central axis thereof. The wafer chuck 22 may have an upper surface, which although not shown in detail, is substantially flat and in a plane to support a semiconductor wafer. Although not shown, it should be understood that the base 20 may include an electric motor, or other actuator, to rotate the wafer chuck 22 about the central axis thereof, along with a semiconductor wafer supported by the wafer chuck 22. The catch cup 24 may substantially be an annular, ring-shaped body attached to the top of the base 20, which tapers toward the central axis of the wafer chuck 22 the further the catch cup 24 extends from the base 20. The TEBR arm 26 may be attached to the base 20 so that it may translate transverse to the plane of the wafer chuck 22 and rotate over the wafer chuck 22.

As shown in FIG. 2, the dispense arm 28 may include a vertical piece 34, a horizontal piece 36, and a dispense head 38. The vertical piece 34 may be vertically attached to the base 20, and the horizontal piece 36 may be attached to the vertical piece 34 at a first end thereof so that it may translate transverse to the plane of the wafer chuck 22 and rotate over the wafer chuck 22. Although not shown in detail, the dispense arm may include a vertical actuator and a rotational actuator that are connected to the computer controller 16. The dispense head 38 may be attached to a second end of the horizontal piece 36, and as illustrated in FIG. 6b, may include a plurality of nozzles 40 which may be directed substantially downwards. The nozzles 40 have include outlet openings at a lower end thereof through which a fluid, such as a liquid may be dispensed.

Referring back to FIG. 2, the photoresist supply line 30 may be attached to the dispense head 38 of the dispense arm 28 at one end thereof and attached to the photoresist pump drawers 18 at the other end thereof.

FIGS. 3, 4, 5, and 6A illustrate the solvent bath 32. The solvent bath 32 may include a bath base 42, a lid 44, and a supply pipe 46. The solvent bath 32 may be made of a plastic-like material, such as high density polyethelene.

Figure 4:
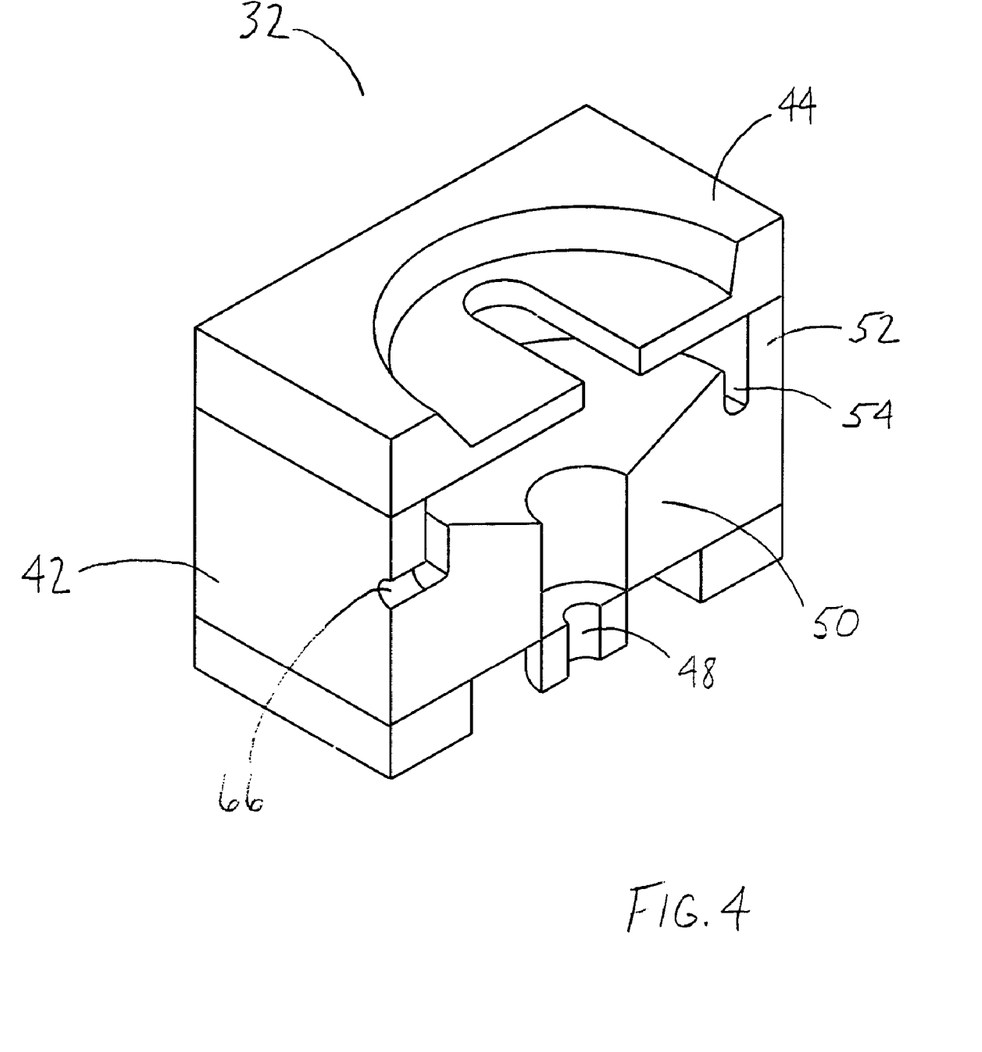
FIG. 4 is a cross-sectional perspective view of the solvent bath.
Figure 5:
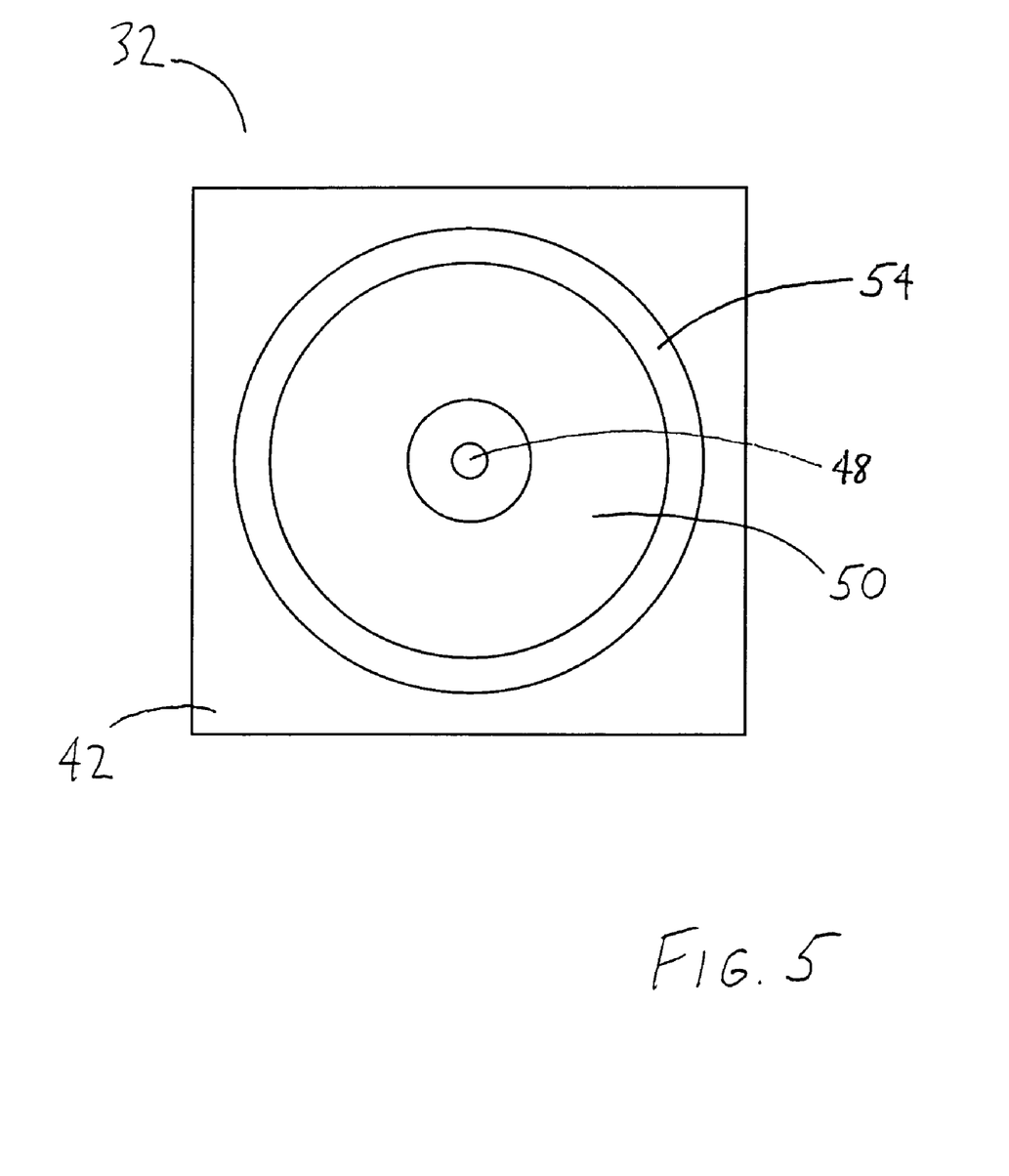
FIG. 5 is a cross-sectional top view on 5-5 in FIG. 3 of the solvent bath.
Figure 6A:
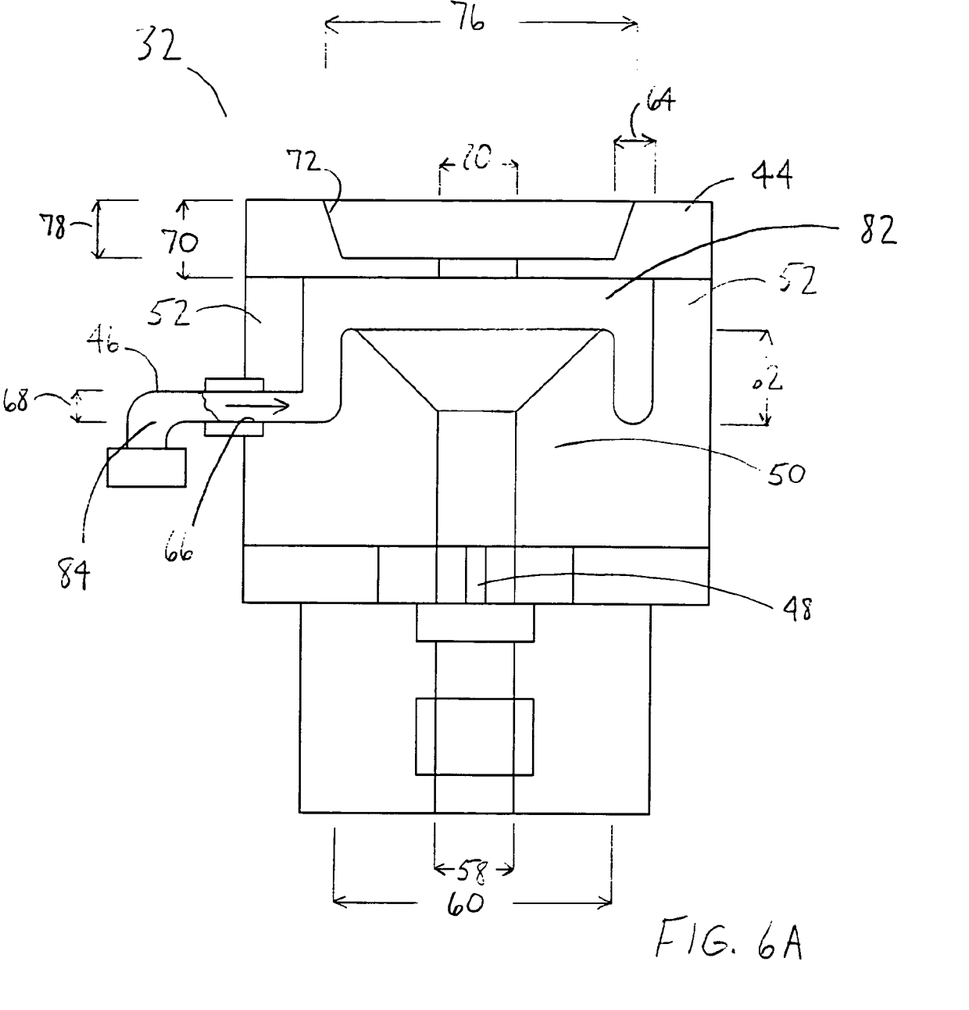
FIGS. 6A-6F are cross-sectional side views on 6-6 in FIG. 3 of the solvent bath, including a dispense head being lowered onto the solvent bath.
Figure 6B:
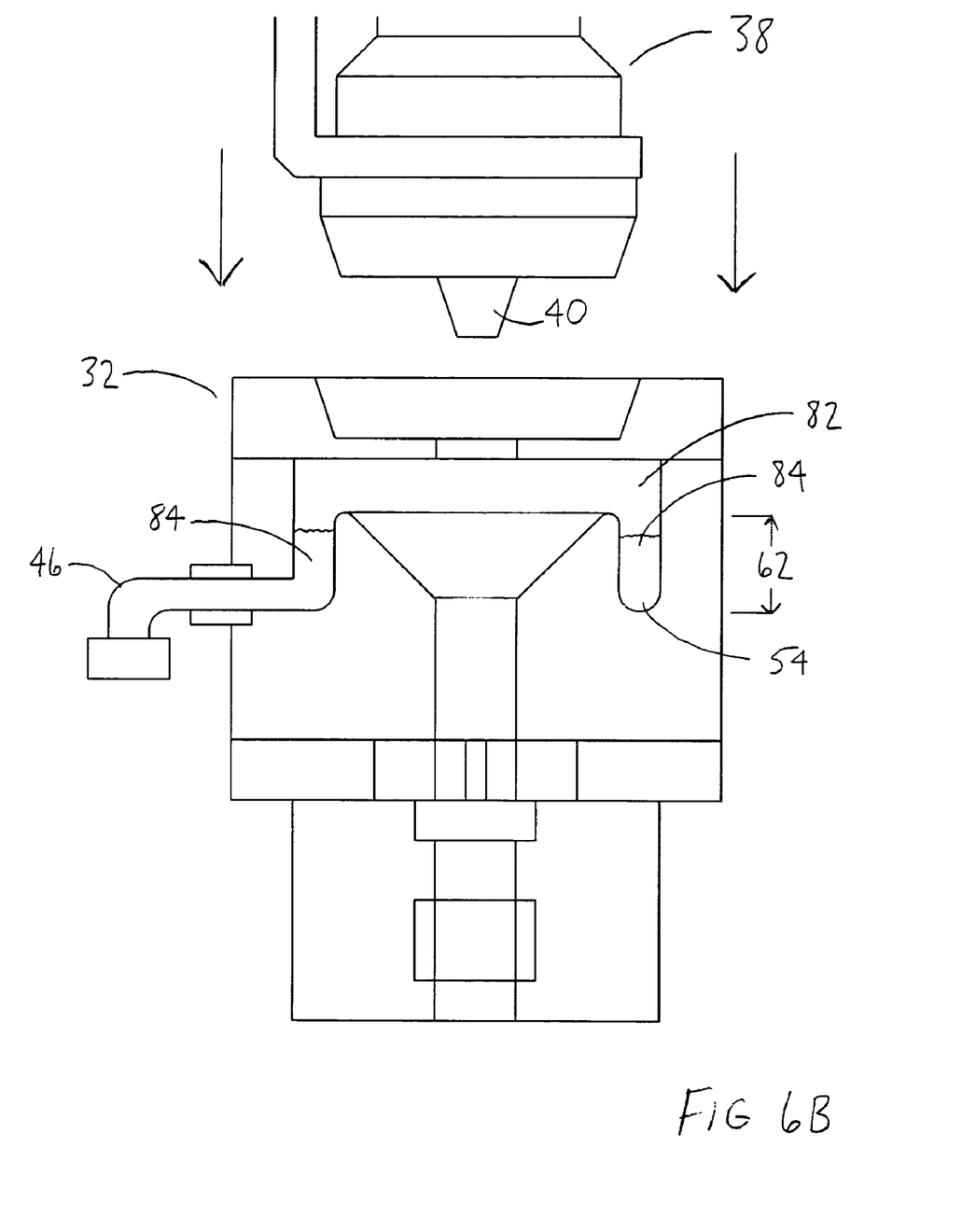

Referring specifically to FIGS. 4, 5, and 6A, the bath base, or lower piece, 42 may be substantially square in shape and may include a drain 48, a funnel structure 50, a sidewall 52, and a reservoir 54. The drain 48 may be a circular aperture through the bath base 42 at a lower, central portion of the bath base 42. The drain 48 may have a diameter of, for example, between 2 and 10 mm. A lower portion of the funnel structure 50 may be cylindrical and extend upwards from around the drain 48 with a first diameter 58 to approximately half of a height of the bath base 42. An upper portion of the funnel structure 50 may be attached to the lower portion and may be conic and extend outwards to a second diameter 60. The funnel structure 50 may circularly symmetric around and concentric with the drain 48.

The sidewall 52 may extend upwards from a periphery of the lower portion of the bath base 42 to a height greater than that of the funnel structure 50. The reservoir 54 may be an annular, ring-shaped air space between a circular inner surface of the sidewall 52 and an outer surface of the upper portion of the funnel structure 50. The reservoir 54 may have a height 62 of, for example, between 5 and 15 mm and a thickness 64 of, for example, between 3 and 8 mm. A portion of the sidewall 52 may have a reservoir inlet 66 therethrough connected to the reservoir 54. The reservoir inlet 66 may have a diameter 68 of, for example, between 2 and 5 mm. As illustrated in FIG. 6A, the reservoir inlet 66 may be connected to the supply pipe 46.

Figure 3:
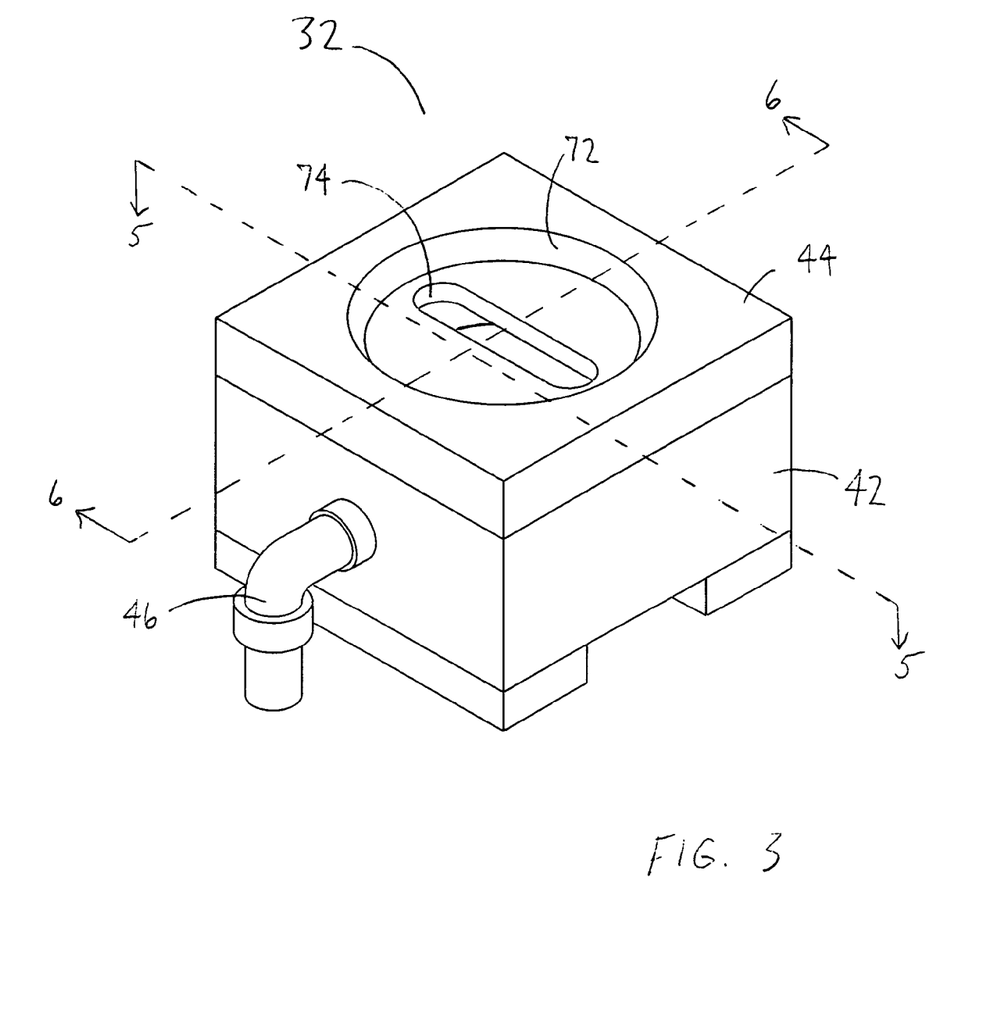
FIG. 3 is a perspective view of the solvent bath.

Referring to FIGS. 3 and 6A, the lid, or upper piece, 44 may be substantially square in shape and connected to an upper portion of the sidewall 52 of the bath base 42. The lid 44 may have a thickness 70 of, for example, between 3 and 7 mm and may include a dispense head recess 72 and a nozzle slot 74.

Referring to FIG. 6A, the dispense head recess 72 may have a diameter 76 of, for example, between 40 and 50 mm and a depth 78 of, for example, between 3 and 8 mm. The nozzle slot 74 lies within the dispense head recess 72 and extends through the lid 44. The nozzle slot 74 may be substantially rectangular with rounded ends and have a length similar to the dispense head recess diameter 76. The nozzle slot 74 may have a width 80 of, for example, between 3 and 8 mm.

The bath base 42 and the lid 44 may jointly form a casing for the solvent bath. A chamber, or air space, 82 may be formed between the bath base 42 and the lid 44. The chamber 82 may be connected to, or include, the reservoir 54 and the drain 48.

In use, referring back to FIG. 2, a semiconductor substrate, such as a wafer, which may have a diameter, for example, of 200 or 300 mm, may be placed on the wafer chuck 22 of the coater module 14. The computer controller 16 may control the rotational actuator and the vertical actuator to move the dispense arm 28. The vertical actuator may lift the dispense arm 28 to a height sufficient for the dispense head 38 to clear an upper edge of the catch cup 24. The rotational actuator may then rotate the dispense arm 28 so that the dispense head 38 is suspended above the semiconductor wafer. A liquid, such as a photoresist, or other such semiconductor processing liquid, may then be pumped from the photoresist supply drawers 18, through the dispense head 38 and dispensed onto the semiconductor wafer through the nozzles 40 on the dispense head 38.

When the dispense head 38 is finished dispensing the liquid onto the wafer, the computer controller 16 may move the dispense arm 28 so that the dispense head 38 is suspended above the solvent bath 32, as illustrated in FIG. 6B. When the dispense head 38 is above the semiconductor wafer or the solvent bath 32, the outlet openings on the nozzles 40 may be exposed to a first medium, such as an uncontrolled, ambient atmosphere, within the wafer processing system.

As illustrated in FIGS. 6A and 6B, a fluid 84, such as a solvent, which may or may not be a component in the photoresist solution, may be pumped into the reservoir 54 of the solvent bath 32 through the supply pipe 46. The fluid 84 may be initially pumped to a depth similar to the reservoir height 62. The fluid 84 may be highly volatile, or have a high vapor pressure, so that the chamber 82 of the solvent bath is filled with air saturated with micro particles of the fluid 84 because of the evaporation of the fluid 84.

Figure 6C:
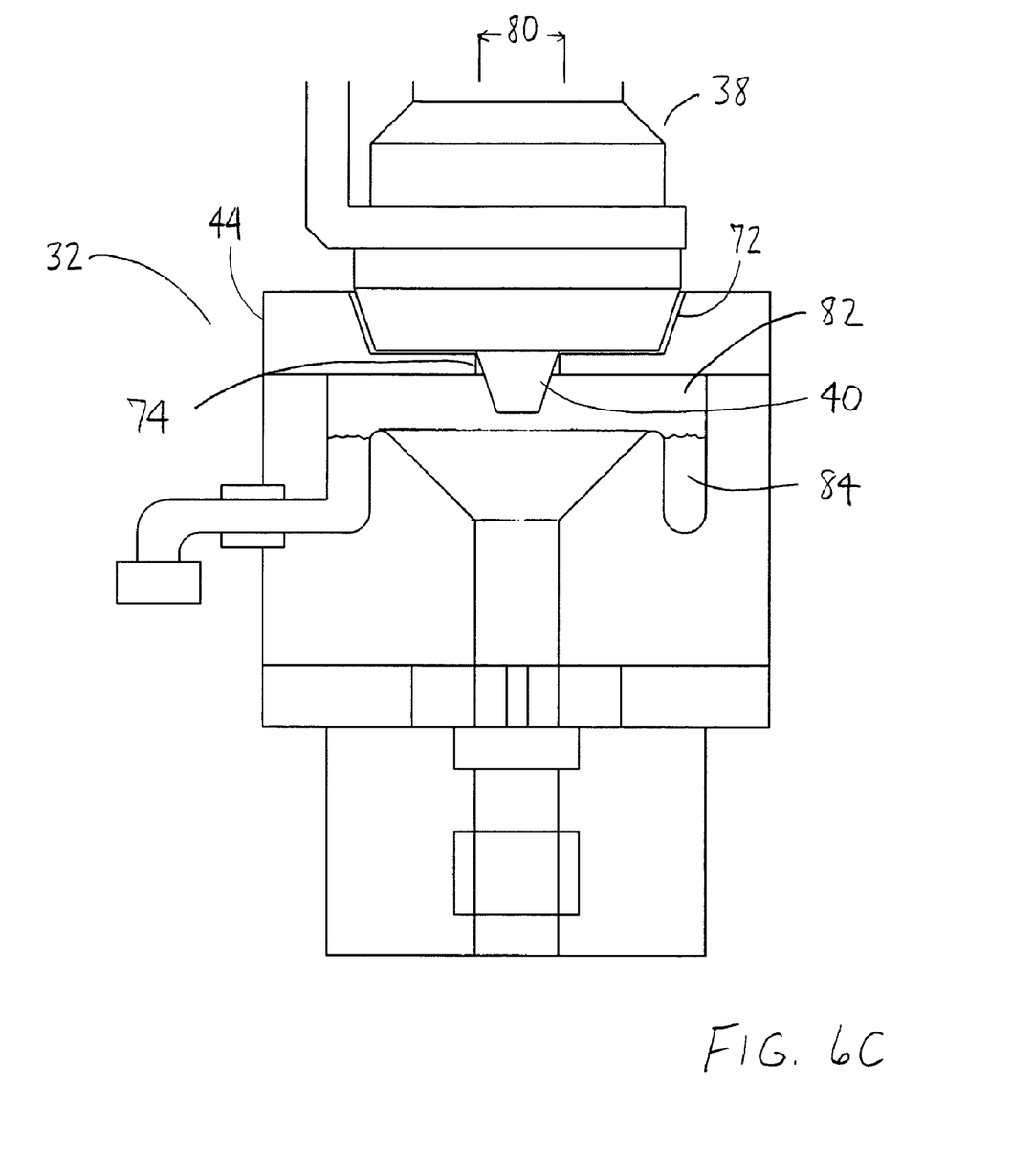

Referring to FIGS. 6B and 6C, the dispense head 38 may be lowered into the dispense head recess 72 on the lid 44 of the solvent bath 32 to engage with the solvent bath 32. The dispense head may not make contact with the lid 44. A gap of, for example, 0.05 mm may be left between the dispense head 38 and the lid 44. As illustrated, the dispense head recess 72 may be shaped to fit the dispense head 38. A diameter of the nozzles 40 may be approximately the same as the nozzle slot width 80. The combination of the fit of the dispense head 38 into the dispense head recess 72 and the fit of the nozzle 40 into the nozzle slot 74 may substantially seal the chamber 82 so that only a minimal amount of saturated air within the chamber 82 may escape through the nozzle slot 74. Therefore, the nozzles 40 are exposed to a second medium, such as a controlled atmosphere, particularly a controlled atmosphere saturated with the fluid 84. The nozzles 40 may not contact the fluid in the reservoir.

Figure 6D:
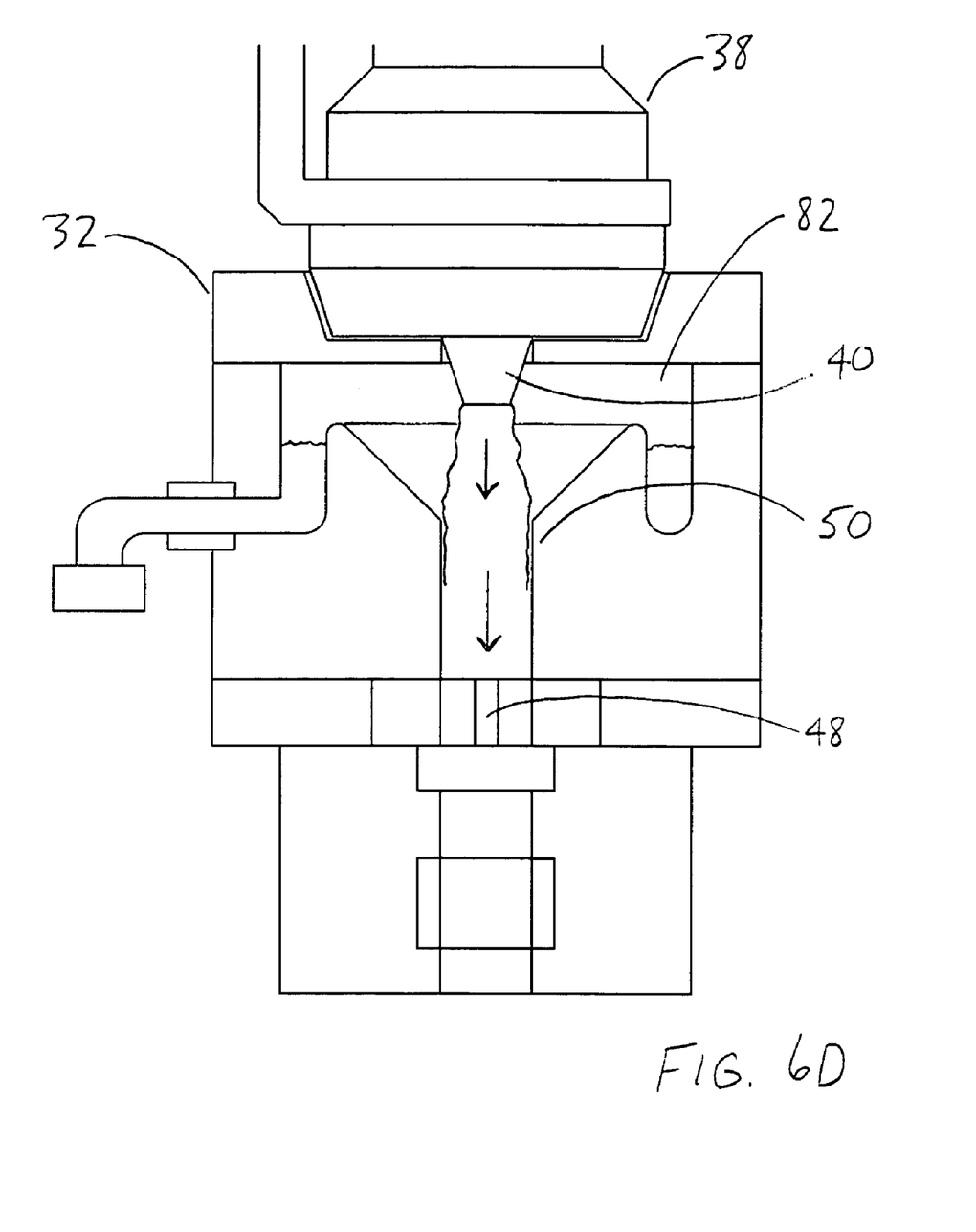

As illustrated in FIG. 6D, in order to clean out the dispense head 38, some of the liquid within the dispense head 38 may be purged, or dispensed, through the nozzles 40 while the dispense head 38 is positioned on, or engaged with, the solvent bath 32. The liquid purged from the dispense head 38 is funneled by the funnel structure 50 into the drain 48 and may exit the solvent bath automatically, due to the shape and position of the funnel structure 50. The purged liquid may exit the solvent bath through the drain 48 without entering the reservoir 54 or mixing with the fluid 84 within the reservoir 54. Because of the size of the funnel structure 50, every nozzle 40 may be purged at the same time while the dispense head 38 is in a single position. After the purging is complete, the dispense head 38 may remain on the solvent bath 32 without any danger of the liquid within the dispense head 38 drying within the nozzles 40 because the saturated air within the chamber 82 keeps the liquid within the nozzles 40 moist. The purging of the liquid may take place before the dispense head 38 dispenses the photoresist onto the semiconductor wafer.

Although not illustrated, it should be understood that the dispense head 38 may be moved back over the semiconductor wafer support to dispense photoresist onto different semiconductor wafers as the wafers are moved into and out of the module.

Figure 6E:
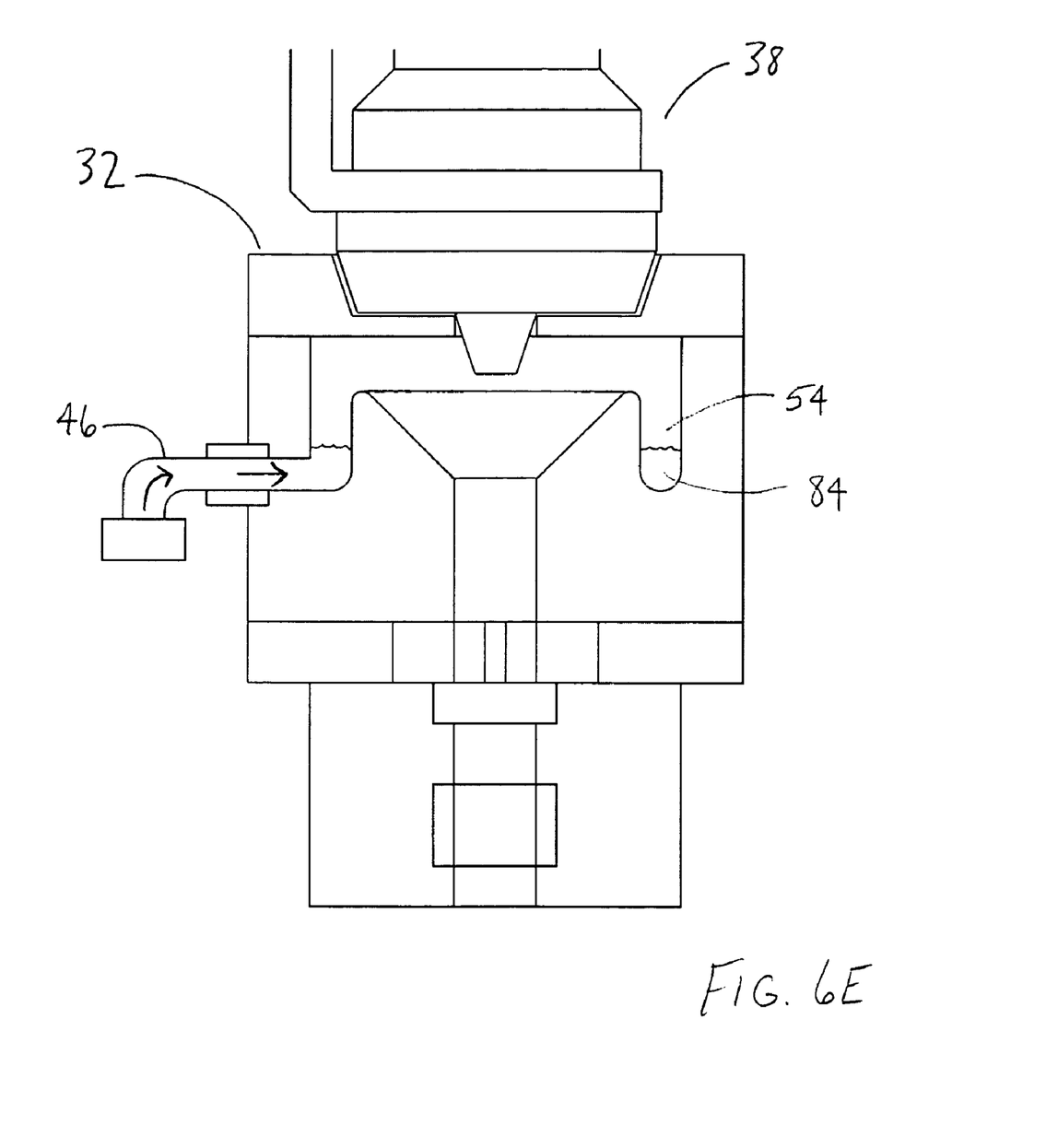
Figure 6F:
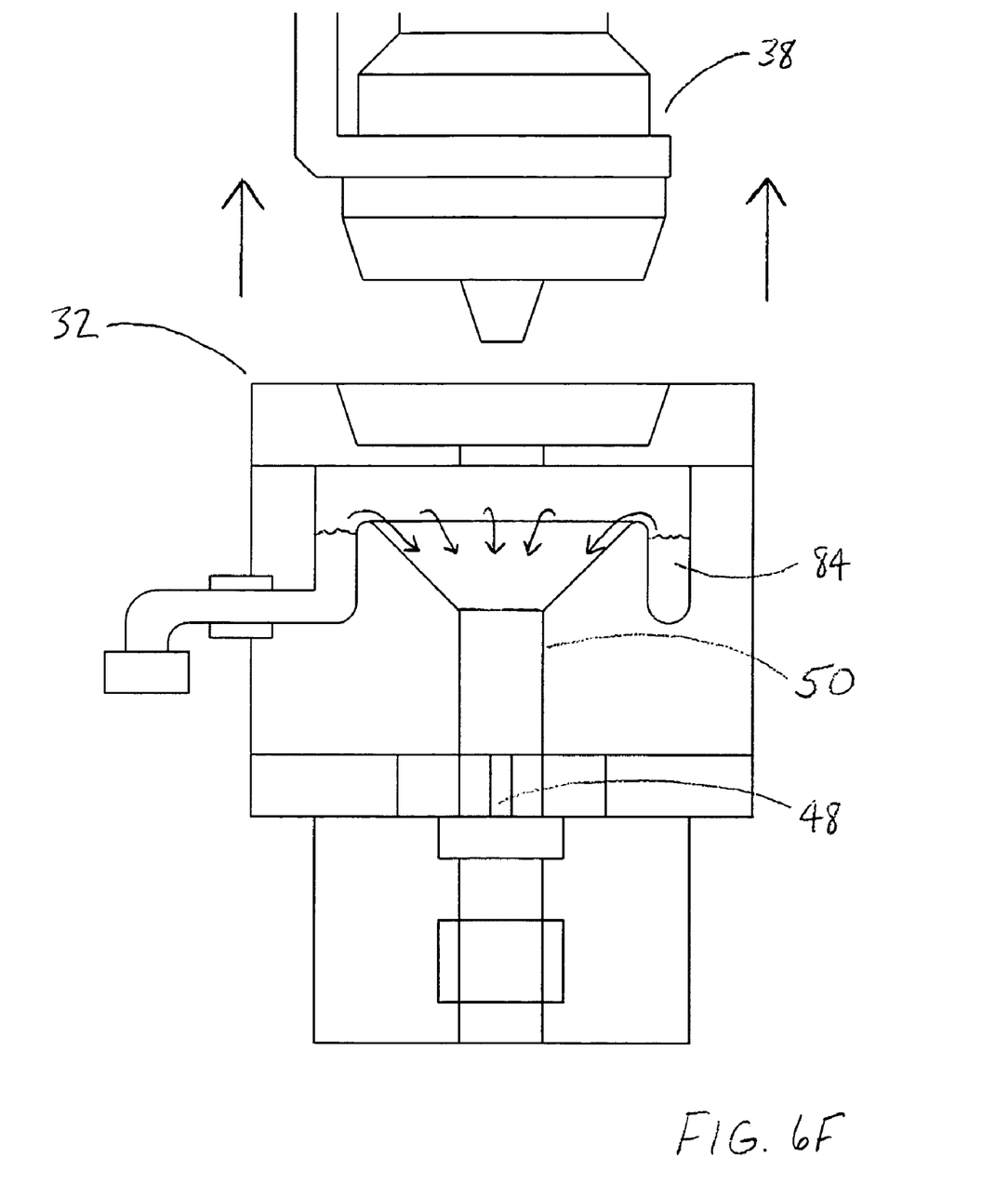

Referring to FIG. 6E, if the depth of the fluid 84 drops to an unfavorable depth due to evaporation, more fluid 84 may be pumped into the reservoir 54 through the supply pipe 46. As illustrated in FIG. 6F, if such a volume of fluid 84 is pumped into the reservoir 54 that the depth of fluid rises above the funnel structure 50, the fluid 84 simply flows down the funnel structure 50 into the drain 48. The drain 48 may be connected to and lead the liquid to either a disposal or a recycle system.

One advantage is that all of the nozzles on the dispense head can be purged and exposed to the solvent bath simultaneously while the dispense head is in the same position. The movements of the dispense head are thus minimized. Therefore, the rate at which the semiconductor wafers can be processed is increased and the wear on the dispense arm is decreased, thereby improving the longevity, durability, and reliability of the dispense arm. Another advantage is that because the nozzles on the dispense head are kept moist, the photoresist does not have to be purged from the dispense head nearly so often. The photoresist needs to be purged approximately only every four hours or more. A further advantage is that because the chamber is substantially sealed while the dispense head is on the solvent bath, the amount of solvent that is lost to evaporation is minimized. A further advantage is that liquid purged from the dispense head into the solvent bath may be drained without mixing with the solvent in the reservoir, thus minimizing the cleaning frequency of the bath and reducing the risk of contaminating the dispense head nozzles.

Other embodiments may use different shapes for the solvent bath, as the funnel and the reservoir do not have to be concentric with the drain. The solvent bath may be used for wafer processing machines that dispense other types of solvents, such as photoresist developer solvents. When the dispense head is placed onto the solvent bath, the nozzle slot may be completely sealed so that no saturated air may leave the chamber. The solvent bath may be used in machines that process other types of semiconductor substrates, such as liquid crystal displays. The solvent bath may be used on other types of machines besides wafer processing machines, such as a ink jet head on a printer or any machine that includes a dispense head in which a liquid may dry and cause damage.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A semiconductor substrate processing apparatus, comprising:
   a frame;
   a substrate support mounted to the frame to support a semiconductor substrate;
   a dispense head, having at least one outlet opening, connected to the frame for movement relative to the semiconductor substrate;
   a solvent bath attached to the frame having a reservoir and a drain, the reservoir holding a first fluid, the solvent bath shaped such that when the dispense head is in a selected position in the solvent bath, a second fluid dispensed from the at least one outlet opening enters the drain without mixing with the first fluid in the reservoir, while the at least one outlet opening is exposed to air saturated with vapor of the first fluid in the reservoir,
   wherein the solvent bath includes a recess for the dispense head to engage the solvent bath such that a fit of the dispense head into the recess substantially seals the solvent bath such that only a minimal amount of the saturated air escapes therethrough,
   wherein the dispense head is moveable between a first position and a second position relative to the semiconductor substrate,
   wherein when the dispense head is in the first position the second fluid dispensed from the at least one outlet opening flows onto the semiconductor substrate and the second position is the selected position,
   wherein the dispense head further comprises at least one nozzle, the at least one outlet opening being at an end thereof; and
   wherein the solvent bath further comprises a casing having a chamber therein and an opening connected to the chamber and sized to fit the at least one nozzle of the dispense head,
   wherein the recess helps guide the dispense head into position, when the dispense head is slightly misaligned in the second position, without a tip of the at least one nozzle of the dispense head contacting the opening in the casing sized to fit the at least one nozzle of the dispense head.

2. The semiconductor substrate processing apparatus of claim 1, wherein the nozzle does not contact the first fluid held in the reservoir.

3. The semiconductor substrate processing apparatus of claim 2, wherein when the dispense head is in the second position, a fit between the dispense head and the opening substantially seal the chamber.

4. The semiconductor substrate processing apparatus of claim 3, wherein the casing further comprises a base, a side wall, and a top piece.

5. The semiconductor substrate processing apparatus of claim 4, wherein the drain and the reservoir are attached to the base of the casing, the opening is in the top piece of the casing, and the side wall interconnects the base and the top piece.

6. The semiconductor substrate processing apparatus of claim 5, further comprising a funnel structure connected to the drain.

7. The semiconductor substrate processing apparatus of claim 6, wherein the funnel structure is circularly symmetric and concentric with the drain.

8. The semiconductor substrate processing apparatus of claim 7, wherein the reservoir surrounds the funnel structure.

9. The semiconductor substrate processing apparatus of claim 8, wherein the first fluid and the second fluid are liquids.

10. The semiconductor substrate processing apparatus of claim 9, wherein the first fluid and the second fluid have at least one component in common.

11. The semiconductor substrate processing apparatus of claim 10, wherein the first fluid and the second fluid are semiconductor processing liquids.

12. The semiconductor substrate processing apparatus of claim 11, wherein the first fluid is a solvent and the second fluid is photoresist.

13. A semiconductor substrate processing apparatus, comprising:
a frame;
a substrate support mounted to the frame to support a semiconductor substrate;
a dispense head, having at least one outlet opening, connected to the frame and being moveable between a first and a second position relative to the substrate support, the at least one outlet opening being exposed to a first medium when the dispense head is in the first position; and
a solvent bath attached to the frame having a reservoir and a drain, the reservoir holding a first fluid, the solvent bath shaped such that when the dispense head is in a second position in the solvent bath, a second fluid dispensed from the at least one outlet opening enters the drain without mixing with the first fluid in the reservoir, while the at least one outlet opening is exposed to a air saturated with vapor of the first fluid in the reservoir,
wherein the solvent bath includes a recess for the dispense head to engage the solvent bath such that a fit of the dispense head into the recess substantially seals the solvent bath such that only a minimal amount of saturated air escape therethrough,
wherein when the dispense head is in the first position, the second fluid is dispensed from the at least one outlet opening flows onto the semiconductor substrate,
wherein the dispense head further comprises at least one nozzle, the at least one outlet opening being at an end thereof,
wherein the recess helps guide the dispense head into position, when the dispense head is slightly misaligned in the second position, without a tip of the at least one nozzle of the dispense head contacting the recess in the solvent bath,
wherein the nozzle does not contact the first fluid held in the reservoir;
wherein when the dispense head is in the second position substantially no saturated air leaves the solvent bath through an opening in a casing of the solvent bath;
wherein the solvent bath further comprises a base, a side wall, and a top piece;
wherein the drain and the reservoir are attached to the base of the solvent bath, the opening is in the top piece of the solvent bath, the side wall interconnects the base and the top piece;
wherein the solvent bath further comprises a funnel structure connected to the drain, the funnel structure being circularly symmetric and concentric with the drain.

14. The semiconductor substrate processing apparatus of claim 13, wherein the reservoir surrounds the funnel structure.

15. An apparatus comprising;
a casing having a chamber therein and an opening connected to the chamber and sized to fit at least one nozzle of a dispense head;
a reservoir within the chamber to hold a fluid; and
a drain within the chamber positioned relative to the opening such that when the at least one nozzle of the dispense head is inserted into the opening a liquid dispensed from the at least one nozzle enters the drain without mixing with the fluid in the reservoir, while the at least one nozzle is exposed to air in the chamber saturated with vapor of the fluid held in the reservoir,
wherein the chamber includes a recess for the dispense head to engage the chamber such that a fit of the dispense head into the recess substantially seals the chamber such that only a minimal amount of saturated air escape therethrough,
wherein the casing further comprises a base, a side wall, and a top piece.
wherein the drain and the reservoir are attached to the base of the casing, the opening is in the top piece of the casing, and the side wall interconnects the base and the top piece,
wherein the base of the casing further comprises a funnel structure connected to the drain, the funnel structure being circularly symmetric and concentric with the drain.

16. The apparatus of claim 15, wherein the reservoir surrounds the funnel structure.

17. The apparatus of claim 15, wherein the recess helps guide the dispense head into position, when the dispense head is slightly misaligned in the second position, without a tip of the at least one nozzle of the dispense head contacting the opening in the top piece of the casing.

18. The apparatus of claim 15, wherein the depth of the recess is approximately equal to the opening in the top piece of the casing.

19. A semiconductor substrate processing apparatus, comprising:
a frame;
a substrate support mounted to the frame to support a semiconductor substrate;
a dispense head, having at least one outlet opening, connected to the frame for movement relative to the semiconductor substrate;
a solvent bath attached to the frame having a reservoir and a drain, the reservoir holding a first fluid, the solvent bath shaped such that when the dispense head is in a selected position in the solvent bath, a second fluid dispensed from the at least one outlet opening enters the drain without mixing with the first fluid in the reservoir, while the at least one outlet opening is exposed to air saturated with vapor of the first fluid in the reservoir,
wherein the solvent bath includes a recess for the dispense head to engage the solvent bath such that a fit of the dispense head into the recess substantially seals the solvent bath such that only a minimal amount of the saturated air escapes therethrough,
wherein the dispense head is moveable between a first position and a second position relative to the semiconductor substrate,
wherein when the dispense head is in the first position the second fluid dispensed from the at least one outlet opening flows onto the semiconductor substrate and the second position is the selected position, wherein the dispense head further comprises at least one nozzle, the at least one outlet opening being at an end thereof;

wherein the solvent bath further comprises a casing having a chamber therein and an opening connected to the chamber and sized to fit the at least one nozzle of the dispense head, wherein the nozzle does not contact the first fluid held in the reservoir, wherein when the dispense head is in the second position, a fit between the dispense head and the opening substantially seal the chamber, wherein the casing further comprises a base, a side wall, and a top piece, wherein the drain and the reservoir are attached to the base of the casing, the opening is in the top piece of the casing, and the side wall interconnects the base and the top piece; and a funnel structure connected to the drain.

20. The semiconductor substrate processing apparatus of claim 19, wherein the funnel structure is circularly symmetric and concentric with the drain.

21. The semiconductor substrate processing apparatus of claim 20, wherein the reservoir surrounds the funnel structure.

22. The semiconductor substrate processing apparatus of claim 21, wherein the first fluid and the second fluid are liquids.

23. The semiconductor substrate processing apparatus of claim 22, wherein the first fluid and the second fluid have at least one component in common.

24. The semiconductor substrate processing apparatus of claim 23, wherein the first fluid and the second fluid are semiconductor processing liquids.

25. The semiconductor substrate processing apparatus of claim 24, wherein the first fluid is a solvent and the second fluid is photoresist.

26. The semiconductor substrate processing apparatus of claim 19, wherein the recess helps guide the dispense head into position, when the dispense head is slightly misaligned in the second position, without a tip of the at least one nozzle of the dispense head contacting the opening in the casing sized to fit the at least one nozzle of the dispense head.

27. The semiconductor substrate processing apparatus of claim 19, wherein the depth of the recess is approximately equal to the opening in the top piece of the casing.

28. A semiconductor substrate processing apparatus, comprising:

a frame;

a substrate support mounted to the frame to support a semiconductor substrate;

a dispense head, having at least one outlet opening, connected to the frame and being moveable between a first and a second position relative to the substrate support, the at least one outlet opening being exposed to a first medium when the dispense head is in the first position;

a solvent bath attached to the frame having a reservoir and a drain, the reservoir holding a first fluid, the solvent bath shaped such that when the dispense head is in a second position in the solvent bath, a second fluid dispensed from the at least one outlet opening enters the drain without mixing with the first fluid in the reservoir, while the at least one outlet opening is exposed to a air saturated with vapor of the first fluid in the reservoir, wherein the solvent bath includes a recess for the dispense head to engage the solvent bath such that a fit of the dispense head into the recess substantially seals the solvent bath such that only a minimal amount of saturated air escape therethrough, wherein when the dispense head is in the first position, the second fluid is dispensed from the at least one outlet opening flows onto the semiconductor substrate, wherein the dispense head further comprises at least one nozzle, the at least one outlet opening being at an end thereof, wherein the nozzle does not contact the first fluid held in the reservoir, wherein when the dispense head is in the second position substantially no saturated air leaves the solvent bath through an opening in a casing of the solvent bath, wherein the solvent bath further comprises a base, a side wall, and a top piece, wherein the drain and the reservoir are attached to the base of the solvent bath, the opening is in the top piece of the solvent bath, and the side wall interconnects the base and the top piece; and a funnel structure connected to the drain, the funnel structure being circularly symmetric and concentric with the drain.

29. The semiconductor substrate processing apparatus of claim 28, wherein the reservoir surrounds the funnel structure.

30. The semiconductor substrate processing apparatus of claim 28, wherein the recess helps guide the dispense head into position, when the dispense head is slightly misaligned in the second position, without a tip of the at least one nozzle of the dispense head contacting the recess in the solvent bath.

31. The semiconductor substrate processing apparatus of claim 28, wherein the depth of the recess is approximately equal to the opening in the top piece of the casing.

* * * * *

UNITED STATES PATENT AND TRADEMARK OFFICE
CERTIFICATE OF CORRECTION

| | | |
|---|---|---|
| PATENT NO. | : 7,357,840 B2 | Page 1 of 1 |
| APPLICATION NO. | : 10/788578 | |
| DATED | : April 15, 2008 | |
| INVENTOR(S) | : Andrew P. Nguyen | |

It is certified that error appears in the above-identified patent and that said Letters Patent is hereby corrected as shown below:

Column 8
Line 22 please replace "to piece." with --top piece,--.

Signed and Sealed this

Seventeenth Day of February, 2009

JOHN DOLL
*Acting Director of the United States Patent and Trademark Office*